United States Patent
Tippy et al.

(10) Patent No.: US 6,472,859 B1
(45) Date of Patent: Oct. 29, 2002

(54) CAPACITIVELY COUPLED ELECTRICAL GROUND DETECTION CIRCUIT

(75) Inventors: David James Tippy, Ann Arbor, MI (US); James Borninski, Colorado Springs, CO (US); Kenneth James Zalewski, Saline; Tom P. Moyles, Livonia, both of MI (US)

(73) Assignee: Autoliv ASP, Inc., Ogden, UT (US)

( * ) Notice: Subject to any disclaimer, the term of this patent is extended or adjusted under 35 U.S.C. 154(b) by 0 days.

(21) Appl. No.: 09/495,241

(22) Filed: Jan. 31, 2000

(51) Int. Cl.⁷ .................. G01R 19/00; G01R 31/08; G01R 27/26; G01R 27/08
(52) U.S. Cl. .............. 324/76.11; 324/532; 324/678; 324/711
(58) Field of Search ............... 324/76.11, 678, 324/548, 658, 519, 503, 509, 543, 711, 532; 702/58, 57

(56) References Cited

U.S. PATENT DOCUMENTS

| | | | |
|---|---|---|---|
| 4,166,974 A | * 9/1979 | Vermeers | 324/679 |
| 4,492,916 A | 1/1985 | Johnson | |
| 4,628,302 A | * 12/1986 | Barr et al. | 340/620 |
| 4,987,372 A | 1/1991 | Ofori-Tenkorang et al. | |
| 5,274,334 A | * 12/1993 | Mills | 324/678 |
| 5,357,191 A | 10/1994 | Grace et al. | |
| 5,541,523 A | 7/1996 | Tourville et al. | |
| 5,834,943 A | 11/1998 | Miller | |

FOREIGN PATENT DOCUMENTS

| | | |
|---|---|---|
| EP | 0 589 610 A | 3/1994 |
| EP | 0589610 | 3/1994 |
| JP | 62-28677 | 6/1987 |
| JP | 62 028677 | 6/1987 |

OTHER PUBLICATIONS

International Search Report; dated: Oct. 22, 2001 in PCT/US01/03005
Patent Abstracts of Japan—Publication Number 62028677—Publication Date Jun. 6, 1987—Application Date Jul. 7, 1985—Appolcation Number 60169576—Applicant Toyota Motor Corp.

* cited by examiner

Primary Examiner—N. Le
Assistant Examiner—Anjan K. Deb
(74) Attorney, Agent, or Firm—Sally J. Brown; Brinks Hofer Gilson & Lione

(57) ABSTRACT

An electrical ground detection circuit 10 having a first capacitor 18 and a second capacitor 20 which selectively receives a certain amount of voltage. The certain amount of voltage decreases by a certain amount during a period of time, as the capacitor 18 charges. The circuit 10 further includes a controller 16 which measures this period of time and which utilizes this measured period of time to determine whether an electrical assembly 12 is coupled to an electrically grounded member 14.

17 Claims, 2 Drawing Sheets

CAPACITIVELY COUPLED ELECTRICAL GROUND DETECTION CIRCUIT

FIELD OF THE INVENTION

This invention generally relates to an electrical ground detection circuit and more particularly, to a capacitively coupled electrical ground detection circuit which determines whether an assembly is electrically grounded and/or attached to an electrically grounded member.

BACKGROUND OF THE INVENTION

Electrical assemblies or modules, which typically comprise several selectively interconnected electrical/ electronic components which cooperatively provide at least one desired function, are usually required to be connected to electrical ground in order to perform their desired function(s) or objective(s). For example and without limitation, an air-bag assembly must normally be physically and/or "mechanically" connected and/or coupled to a structural member of the vehicle, such as to the body or the "sheet metal" of a vehicle. This vehicle structural member provides an electrical ground to the assembly. Hence, the existence or non-existence of this electrical grounded arrangement may be used to determine whether the air-bag assembly is physically connected or attached to the vehicle member. Particularly, the air-bag assembly is required to be electrically "grounded" (e.g., coupled to the electrical ground which is provided by the body or the "sheet metal" of the vehicle), in order to substantially ensure that the air-bag assembly will be protectably inflated in the event of a vehicle collision. Failure to adequately ensure the continued connection of the air-bag assembly to the vehicle body may cause the air bag to be undesirably inflated as the vehicle is driven or may prevent the air-bag from inflating during a vehicle collision.

While some circuits do exist to determine whether electrical assemblies, such as a vehicle air-bag assembly, are and remain "electrically grounded", these circuits are relatively complex, costly, require relatively large amounts of electrical power, are susceptible to transient noise which causes these circuits to be relatively inaccurate or unreliable, and require a relatively inefficient "analog to digital signal conversion" device or assembly which further increases the overall inaccuracy, cost, and complexity of these circuits.

There is therefore a need for a new and improved electrical ground detection and/or determination circuit and/or assembly which overcomes some or all of the previously delineated drawbacks of such prior electrical ground detection and/or determination circuits.

SUMMARY OF THE INVENTION

It is a first object of the invention to provide an electrical ground detection and/or determination circuit which overcomes some or all of the previously delineated drawbacks of prior electrical ground detection and/or determination circuits or assemblies.

It is a second object of the invention to provide a method for determining whether an electrical assembly is connected to electrical ground and/or is connected to a certain member of a vehicle.

According to a first aspect of the present invention a circuit is provided for use in combination with an electrical assembly of the type which is to be connected to an electrically grounded member. The circuit includes a voltage source which produces an amount of voltage; a first capacitor; a second capacitor which is coupled to the voltage source; a resistor which is coupled to the first and second capacitors and to the electrically grounded member and which cooperates with the voltage source and with the second capacitor to cause the first capacitor to communicatively receive said amount of voltage and to cause said received voltage to decrease by a certain amount within a period of time; and a controller which is coupled to the first capacitor, which measures the period of time, and which utilizes the measured period of time to determine whether the electrical assembly is connected to the electrically grounded member.

According to a second aspect of the present invention a method is provided to determine whether an electrical assembly is attached to a member. The method includes the steps of providing a capacitor of the type which may be selectively and electrically charged; coupling the capacitor to the member; causing the capacitor to receive a certain amount of voltage; and using the certain amount of voltage to determine whether the electrical assembly is attached to the member.

These and other aspects, features, and advantages of the present invention will become apparent by reading the following specification and by reference to the attached drawings.

DETAILED DESCRIPTION OF THE PREFERRED EMBODIMENT OF THE INVENTION

Figure 1:
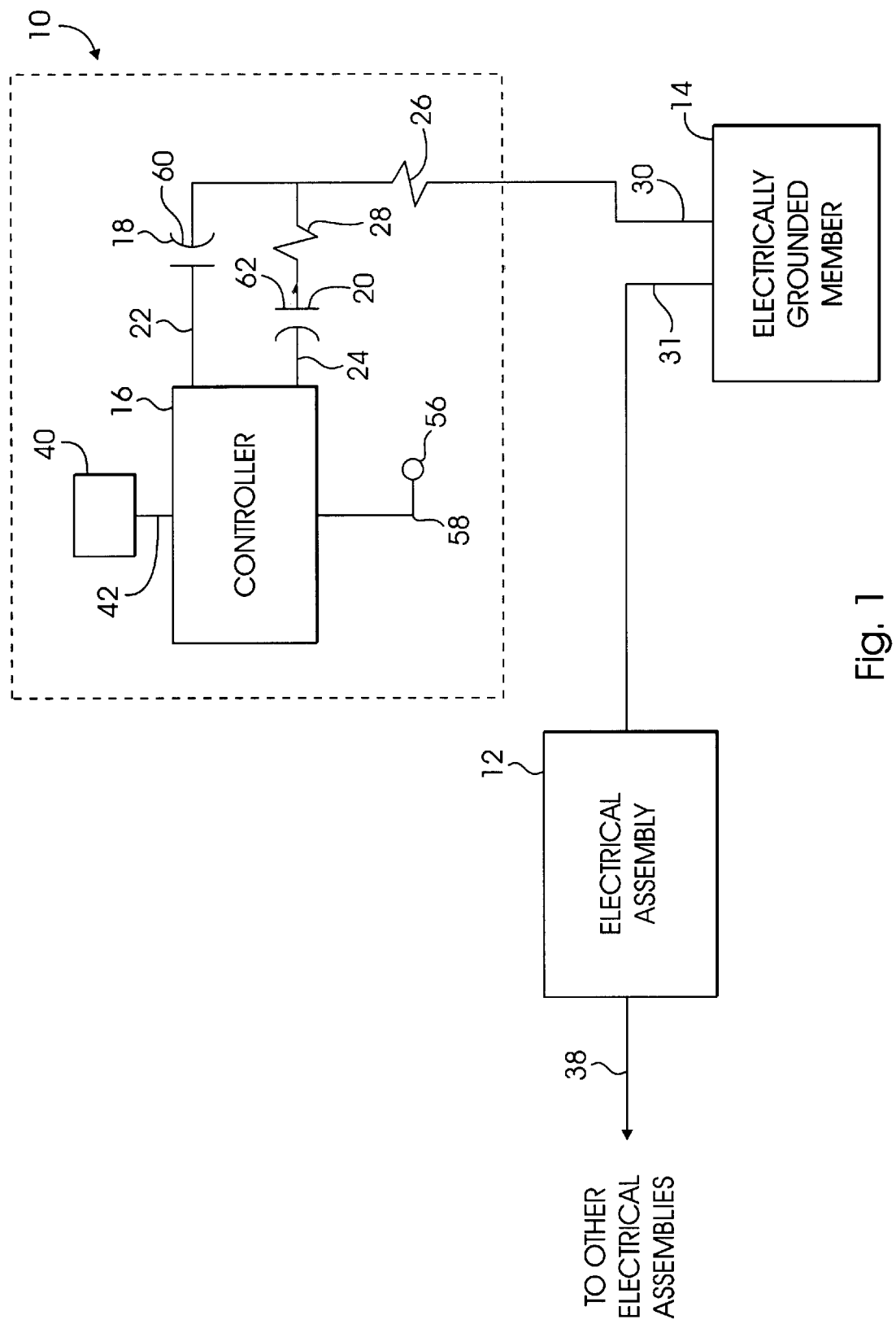
FIG. 1 is an electrical block diagram of an electrical ground detection circuit which is made in accordance with the teachings of the preferred embodiment of the invention.

Referring now to FIG. 1, there is shown an electrical ground detection circuit 10 which is made in accordance with the teachings of the preferred embodiment of the invention. As shown, electrical ground detection circuit 10 is adapted for use in combination with an electrical assembly 12 such as, by way of example and without limitation, a vehicle air-bag assembly or another type of vehicle module. Circuit 10 is further adapted for use with an electrically grounded structure or an electrical ground "providing" member or source 14 to which electrical assembly 12 is operatively connected. In operation, as will be shown and explained below, ground detection circuit 10 determines and/or detects the existence of the required operative connection between assembly 12 and member 14. Circuit 10, in one non-limiting embodiment, may physically and operatively reside within assembly 12 and, in this particular arrangement, circuit 10 and assembly 12 share the same bus, tab, or lead which connects the assembly 12 to member 14. In other non-limiting embodiments, separate busses, tabs, or leads are used to respectively connect assembly 12 and circuit 10 to member 14 (e.g., such as the separate busses, tabs, or leads 30, 31 shown in FIG. 1). However in these "multi-bus" embodiments, assembly 10 and member 12 are "coupled together" or arranged such that disconnection of lead 30 from member 14 is caused by, results in, and/or substantially indicates the disconnection of lead 31 from member 14 (e.g., busses 30, 31 may be resident within the same bus containing structure or "bundle" and/or circuit 10 and assembly 12 or circuit 10 and a portion of assembly 12 may be resident within the same module or structure). In this manner, as explained more fully and completely below, circuit 10 detects whether bus or lead 31 is connected to member 14 by determining whether lead or bus 30 is connected to member 14.

As shown, ground detection circuit 10 includes a controller 16 which may comprise a microprocessor or microcontroller operating under stored program control and first and second capacitors 18,20 which are each communicatively coupled to the controller 16 by respective busses 22,24. In one non-limiting embodiment of the invention, each of the capacitors are substantially identical, each have a capacitance of about 100 nano-farads, and each are of the type which may be selectively and electrically charged and electrically discharged. Capacitor 18 is coupled to a resistor 26 which, in one non-limiting embodiment of the invention, has a resistance of about 6800 ohms, while capacitor 20 is coupled to the resistor 28 which similarly, in one non-limiting embodiment of the invention has a resistance of about 6800 ohms. Resistor 28 is coupled to resistor 26.

As further shown in FIG. 1, resistor 26 is coupled to member 14 by the use of a bus, tab, or lead 30. Electrical assembly 12 is also coupled to the member 14 by the use of bus, tab, or lead 31, and may be coupled to various other electrical assemblies (e.g., the engine control module or various other known modules and/or assemblies which reside within a vehicle) by the use of bus, tab, or lead 38.

Thus, it will be understood that capacitors 18 and 20 are electrically coupled to electrical assembly 12 through resistors 28 and/or 26, and electrically grounded member 14. Circuit 10 also includes a voltage source 40 which provides a certain amount of voltage or electrical charge (e.g., about five volts) and which is coupled to the controller 16 by the use of bus 42. The provided voltage may be selectively "sourced" or communicated to busses 22 and/or 24 by controller 16. In one non-limiting embodiment of the invention, voltage source 40 may comprise the battery of a vehicle or a voltage source which may be "external" from the circuit 10 and which may not necessarily form a part of the circuit 10.

In operation, circuit 10 is initially calibrated by coupling resistor 26, by use of lead, tab, or bus 30, to a known source of electrical ground potential; causing controller 16 to generate, communicate, place or "source" electrical voltage on bus 22; and causing bus 24 to represent and/or form a substantially high impedance digital type input to the controller 16. In one non-limiting embodiment, the voltage and/or electrical charge which is placed onto bus 22 is provided by the voltage source 40 (or another external voltage source) through bus 42 and controller 16.

The provided voltage on bus 22 is cooperatively communicated to and placed upon bus 24 by capacitors 18, 20 and resistor 28. As the capacitor 18 begins to charge, the amount of the provided voltage which is provided to capacitor 24 and placed or communicated onto bus 24 begins to decrease. During this calibration sequence or "routine", the controller 16 determines and selectively stores the period or amount of time in which the capacitor 18 is charged to an electrical charge level or "state" which causes the voltage which is cooperatively communicated to capacitor 20 and placed upon bus 24 to decrease to a certain level or by a certain amount.

Figure 2:
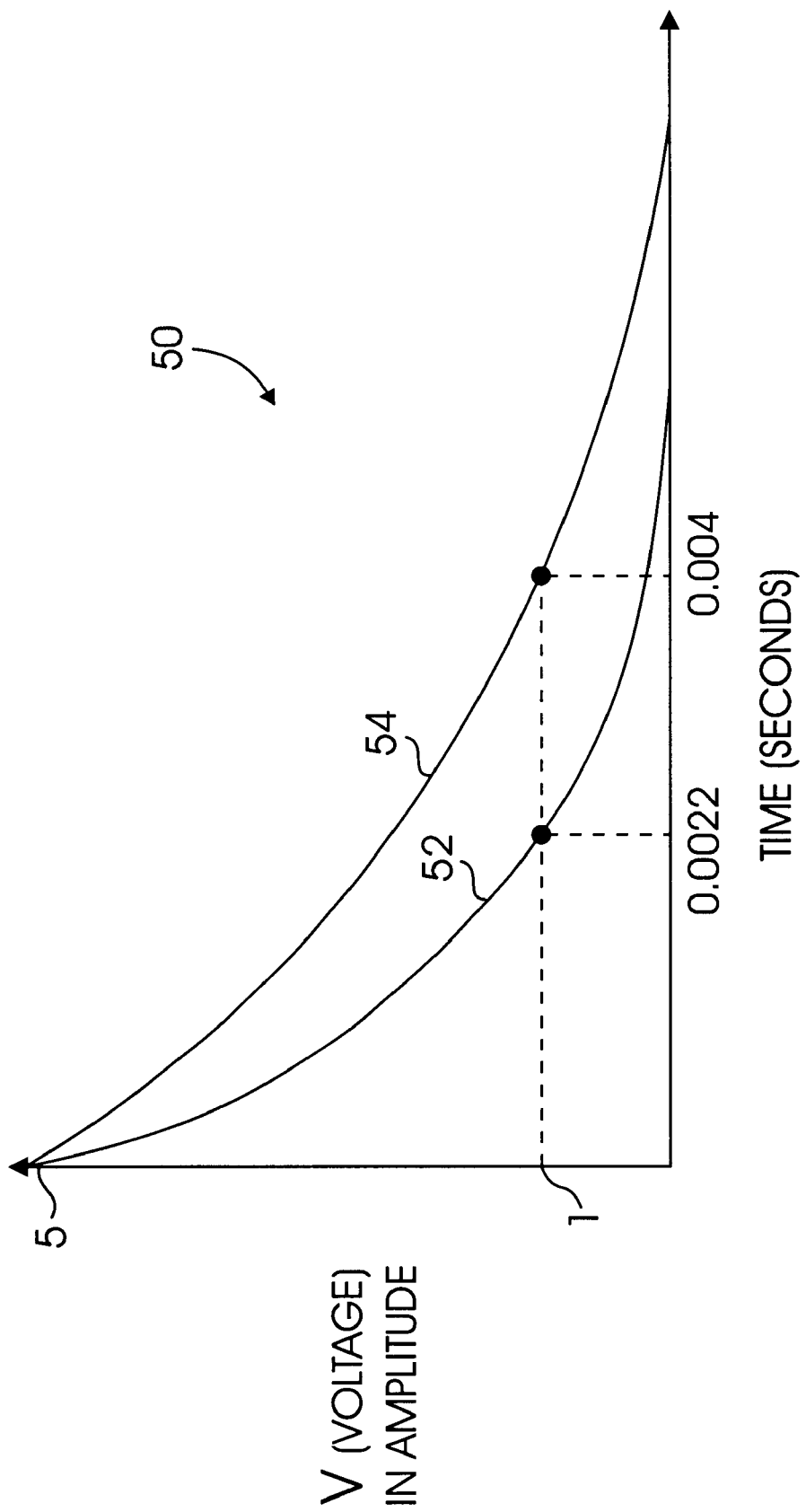
FIG. 2 is a graph illustrating the operation and/or function of the electrical ground detection circuit which is shown in FIG. 1.

That is, as best shown by the calibration data curve 52 within graph 50 of FIG. 2, in one non-limiting embodiment of the invention, an initial voltage or charge equal to about five volts is placed on bus 22 and this voltage is communicated, by resistor 28 and capacitors 18, 20, to bus 24. The voltage, placed upon bus 24, is denoted as "$V_{in}$" within FIG. 2. A period or amount of time equal to about 0.0022 seconds elapses as capacitor 18 charges to a level or by an amount which causes the voltage on bus 24 to "drop" or decrease to a level substantially equal to and/or corresponding to an "input threshold" having a voltage level or amount of about one volt. Other predetermined voltage "input thresholds" may be used in other alternate embodiments of the invention.

As shown by data curve 54, this period or amount of time increases as the impedance between bus, tab or lead 30 and member 14 increases, indicative of a disconnection of lead 30 from member 14. As earlier indicated, this increase in time is used, by circuit 10, to determine the existence of a connection between assembly 12 and member 14. For example, an impedance of about 6800 ohms causes the initial voltage of about five volts, which was placed upon bus 24, to decrease to a voltage level of about one volt after a period of time equal to about 0.004 seconds has elapsed. In one non-limiting embodiment of the invention, this calibrated period of time (e.g., 0.0022 seconds) may be used to determine whether the assembly 12 remains connected to and/or "mounted" to the member 14, although other time periods may also be used. This previously described calibration procedure allows component tolerance type variances or errors (e.g., capacitors 18, 20 and resistors 26, 28) as well as various other error producing variances to be substantially removed or "nulled". Since the previously described calibration sequence provides and/or allows actually operating data (e.g., the decay time of about 0.004 seconds) to be operatively used instead of theoretical computations, the accuracy of the overall circuit 10 is substantially increased.

After initially calibrating the circuit 10 in the foregoing manner, resistor 26 is operatively connected to bus, lead, or tab 30 and controller 16 causes a predetermined amount of voltage (e.g., about five volts) to be placed onto bus 24 as the bus 24 is made to represent/form a substantially high impedance digital type input to controller 16. The controller then measures the amount of time required for the voltage on bus 24 to decrease to a level of about one volt. This measured period of time is used, by controller 16 in combination with the previously calibrated time period, to determine whether the assembly 12 remains connected to member 14. These tests may periodically and automatically be repeated by controller 16.

In one non-limiting embodiment of the invention, circuit 10 may include a selectively energizable annunicator or "warning indicator" 56 which is coupled to the controller 16 by bus 58 and which is selectively energized, thereby providing a visual warning signal, when the controller 16 determines that assembly 12 is not connected to member 14. The warning signal is effective to allow the manual connection or re-connection of assembly 12 to member 14 or to allow appropriate repairs to be made to assembly 12 or to other portions of the vehicle or other apparatuses which operatively contain circuit 10. In another non-limiting embodiment of the invention, controller 16 energizes device 56 when the measured time period or "decay time" is substantially less than the time period associated with a desired connection between member 14 and assembly 12 (e.g., about 0.0022 seconds). Such a "decreased time period" is usually indicative of a malfunction within the circuit 10, and device 56 provides selective notification of such an occurrence in order to allow the malfunction to be corrected.

It should be realized that circuit 10 allows for the automatic testing of and/or determination of the existence of the connection of the assembly 12 to the electrical ground member 14 without the use of an analog to digital converter, in a relatively simple and cost effective manner, and by the use of a relatively low power microprocessor or controller 16. Moreover, it should be further realized that circuit 10 provides these desirable benefits and maintains these benefits even upon receipt of transient noise, such as that which is communicated to controller 16 by or on bus 22.

That is, the transient noise (which may be caused, for example and without limitation, by the use of dissimilar busses, tabs, or leads 30, 31) is electrically nulled by the cooperative arrangement of the capacitors 18, 20 before it reaches the controller 16 through bus 24, since the negative plate or portion 60 of capacitor 18 is coupled to the positive plate in portion 62 of capacitor 20 through resistor 28. Hence, capacitors 18,20 electrically and cooperatively isolate the controller 16 from this transient noise and allow circuit 10 to maintain a substantially accurate operation.

In one non-limiting embodiment of the invention, busses 22 and 24, after each test, are "driven low" or respectively coupled to a source of electrical ground potential which is resident within and/or selectively generated by the controller 16. This causes the electrical charge, which appears upon and/or is contained upon capacitors 18, 20 and which is created by the voltage source 40 and/or by transient noise, such as the noise which occurs upon lead or bus 30, to be "nulled" in the previously described manner.

It should be realized that this invention is not limited to the exact construction or method which has been illustrated and described above, but that various changes, alterations, and/or modifications may be made without departing from the spirit and the scope of the invention.

What is claimed is:

1. An electrical circuit for use in combination with a voltage source which produces a first amount of voltage and an electrical assembly of the type which is selectively connected to an electrically grounded member, said circuit comprising:
    a first capacitor which is coupled to said electrically grounded member;
    a second capacitor which is coupled to said electrically grounded member and to said voltage source;
    a resistor which is coupled to said first and to said second capacitors and to said electrically grounded member and which cooperates with said voltage source and with said second capacitor to selectively charge said first capacitor to an amount of voltage that is substantially equal to said first amount and to thereafter cause said amount of voltage to decrease within a period of time; and
    a controller which is coupled to said first capacitor, which measures said period of time, and which utilizes said measured period of time to determine whether said electrical assembly is connected to said electrically grounded member.

2. The electrical circuit of claim 1 further comprising an alarm which is coupled to the controller and which is selectively energized by said controller in the event that said electrical assembly is disconnected from said electrically grounded member.

3. The electrical circuit of claim 1 wherein said electrically grounded member comprises a portion of a vehicle.

4. The electrical circuit of claim 3 wherein said electrical assembly comprises a vehicle air-bag assembly.

5. The electrical circuit assembly of claim 1 wherein said first and second capacitors are substantially similar.

6. The electrical circuit assembly of claim 5 wherein said first and second capacitors each have a capacitance of about 100 nanofarads.

7. The electrical assembly of claim 1 wherein said resistor has a resistance of about 6800 ohms.

8. The electrical circuit assembly of claim 1 wherein said first capacitor has a positively charged portion, wherein said second capacitor has a negatively charged portion, and wherein said positively charged portion of said first capacitor is coupled to said negatively charged portion of said second capacitor.

9. A method for determining whether an assembly is attached to an electrically grounded member, said method comprising the steps of:
    providing a capacitor of the type which may be electrically charged;
    coupling said capacitor to said electrically grounded member;
    selectively charging said capacitor by a certain amount;
    determining a first time period in which said capacitor discharges a predetermined amount of voltage; and
    comparing said first time period to a calibration time period to determine whether said electrical assembly is attached to said electrically grounded member.

10. The method of claim 9 wherein said electrically grounded member comprises the body of a vehicle.

11. The method of claim 10 wherein said electrical assembly comprises an air bag assembly.

12. The method of claim 9 further comprising the steps of:
    coupling said capacitor to a voltage source;
    charging said capacitor by said certain amount, said capacitor being charged by said certain amount within a certain second period of time;
    measuring said second period of time; and
    using said second period of time to determine whether said electrical assembly is attached to said member.

13. The method of claim 9 wherein said step of charging said capacitor comprises the steps of:
    providing a voltage source; and
    selectively coupling said capacitor to said voltage source.

14. A method for determining whether a vehicle air-bag assembly is attached to a body of the vehicle, said method comprising the steps of:
    providing a first and a second capacitor;
    providing a resistor;
    connecting said resistor to said body of said vehicle;
    connecting said first and second capacitors to said resistor;
    selectively charging said first capacitor using a source of voltage;
    determining a first time period in which said first capacitor discharges a predetermined amount of voltage; and
    comparing said first time period to a calibration time period to determine whether said vehicle air bag is connected to said vehicle body.

15. The method of claim 14 wherein said first and second capacitors are substantially identical.

16. The method of claim 15 wherein said first and second capacitors each have a capacitance of about 100 nanofarads.

17. The method of claim 14 wherein said resistor has a resistance of about 6800 ohms.

* * * * *